United States Patent
Richter et al.

(10) Patent No.: US 7,858,531 B2
(45) Date of Patent: Dec. 28, 2010

(54) METHOD OF FORMING A SEMICONDUCTOR STRUCTURE COMPRISING A FIELD EFFECT TRANSISTOR HAVING A STRESSED CHANNEL REGION

(75) Inventors: Ralf Richter, Dresden (DE); Joerg Hohage, Dresden (DE); Michael Finken, Dresden (DE); Jana Schlott, Wachau (DE)

(73) Assignee: Advanced Micro Devices, Inc., Austin, TX (US)

( * ) Notice: Subject to any disclaimer, the term of this patent is extended or adjusted under 35 U.S.C. 154(b) by 200 days.

(21) Appl. No.: 12/017,793

(22) Filed: Jan. 22, 2008

(65) Prior Publication Data
US 2009/0001453 A1    Jan. 1, 2009

(30) Foreign Application Priority Data
Jun. 29, 2007    (DE) ...................... 10 2007 030 021

(51) Int. Cl.
  *H01L 21/469* (2006.01)
(52) U.S. Cl. .................. 438/763; 438/787; 257/E21.09
(58) Field of Classification Search ................ 438/761, 438/763, 778, 787–794; 257/E21.09, E21.091, 257/E21.632, E21.318, E21.002, E21.409
See application file for complete search history.

(56) References Cited

U.S. PATENT DOCUMENTS

| 5,674,781 | A  | * | 10/1997 | Huang et al. ................. 438/629 |
| 6,475,925 | B1 | * | 11/2002 | Braeckelmann et al. ...... 438/763 |
| 2006/0091471 | A1 | * | 5/2006 | Frohberg et al. ............ 257/369 |
| 2006/0223255 | A1 |   | 10/2006 | Chen et al. ................... 438/199 |
| 2006/0292774 | A1 | * | 12/2006 | Chen et al. ................... 438/197 |

OTHER PUBLICATIONS

Machida et al. "Improvement of Water-Related Hot-Carrier Reliability by Using ECR Plasma-SiO2." IEEE Transactions on Electron Devices, 1994; 41(5): 709-714.*

* cited by examiner

*Primary Examiner*—Sue Purvis
*Assistant Examiner*—W. Wendy Kuo
(74) *Attorney, Agent, or Firm*—Williams, Morgan & Amerson, P.C.

(57) ABSTRACT

A method of forming a semiconductor structure comprises providing a semiconductor substrate comprising at least one transistor element. An etch stop layer is formed over the transistor element. A stressed first dielectric layer is formed over the etch stop layer. A protective layer adapted to reduce an intrusion of moisture into the first dielectric layer is formed over the first dielectric layer. At least one electrical connection to the transistor element is formed. At least a portion of the protective layer remains over the first dielectric layer after completion of the formation of the at least one electrical connection.

14 Claims, 8 Drawing Sheets

METHOD OF FORMING A SEMICONDUCTOR STRUCTURE COMPRISING A FIELD EFFECT TRANSISTOR HAVING A STRESSED CHANNEL REGION

BACKGROUND OF THE INVENTION

1. Field of the Invention

General, the present disclosure relates to the formation of integrated circuits, and, more particularly, to the formation of field effect transistors having a channel region with a specified intrinsic stress so as to improve the charge carrier mobility.

2. Description of the Related Art

Integrated circuits comprise a large number of individual circuit elements such as, e.g., transistors, capacitors and resistors. These elements are connected internally to form complex circuits, such as memory devices, logic devices and microprocessors. The performance of integrated circuits may be improved by increasing the number of functional elements in the circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible. In modern semiconductor structures, features having a critical dimension of 90 nm or less, or even 65 nm or less, may be formed.

Field effect transistors are used as switching elements in integrated circuits. They allow control of a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and on the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive stress. This leads to a modified mobility of electrons and holes, respectively. A compressive stress in the channel region increases the mobility of holes. Depending on the magnitude of the compressive stress, an increase of the hole mobility of up to 15% may be achieved. In a P-type transistor, this leads to a corresponding increase of the conductivity of the channel region. Conversely, a tensile stress in the channel region increases the mobility of electrons. Thus, the performance of N-type transistors may be enhanced by providing a tensile stress in the channel region.

A method of forming a semiconductor structure comprising field effect transistors having stressed channel regions according to the state of the art will be described with reference to FIGS. 1a-1b. FIG. 1a shows a schematic cross-sectional view of a semiconductor structure 100 in a first stage of the prior art manufacturing process.

The semiconductor structure 100 comprises a substrate 101, a first transistor element 102 and a second transistor element 202. A trench isolation structure 103 provides electrical insulation between the first transistor element 102 and the second transistor element 202.

The first transistor element 102 comprises a gate electrode 106 and an active region 104. A gate insulation layer 105 separates the gate electrode 106 from the active region 104 and electrically insulates the gate electrode 106 from the active region 104. Adjacent the gate electrode 106, a sidewall spacer structure 112, a source region 107 and a drain region 108 are formed. In the source region 107, in the drain region 108 and at the top surface of the gate electrode 106, silicide regions 109, 110, 111 may be formed.

Similar to the first transistor element 102, the second transistor element 202 may comprise an active region 204, a gate electrode 206, a gate insulation layer 205, a source region 207, a drain region 208, a sidewall spacer structure 212 and silicide regions 209, 210, 211.

The first transistor element 102 and the second transistor element 202 may be transistors of a different type. For example, the first transistor element 102 may be a P-type transistor and the second transistor element 202 may be an N-type transistor.

As persons skilled in the art know, the above-described features may be formed by means of well-known techniques of photolithography, etching, ion implantation, deposition, oxidation and annealing.

An etch stop layer 113 is formed over the semiconductor structure 100. The etch stop layer 113 may comprise a dielectric material such as, for example, silicon nitride, and may be formed by means of known deposition techniques, such as plasma enhanced chemical vapor deposition (PECVD). The etch stop layer 113 may comprise an intrinsic stress.

In plasma enhanced chemical vapor deposition, the semiconductor structure 100 is provided in a reactor vessel, and a reactant gas is supplied to the reactor vessel. In the reactant gas, a glow discharge is created by applying a radio frequency alternating voltage between electrodes provided in the reactant gas or by inductively coupling the radio frequency alternating voltage to the reactant gas. In addition to the radio frequency alternating voltage, a bias voltage, which may be a direct voltage or a low frequency alternating voltage, may be applied. In the glow discharge, chemically reactive species such as atoms, molecules and ions may be created from the reaction gas. The reactive species may react with each other on the surface of the semiconductor structure 100 or in the vicinity thereof. In the reaction, the material of the etch stop layer may be formed and may be deposited on the semiconductor structure 100.

Properties of the etch stop layer 113 may be controlled by varying parameters of the plasma enhanced chemical vapor deposition process, such as power and frequency of the radio frequency alternating voltage and the bias voltage, temperature and pressure in the reactor vessel, and the composition of the reactant gas. In particular, the intrinsic stress of the etch stop layer 113 may be controlled by varying these parameters. Parameter sets which allow obtaining a predetermined tensile or compressive stress in the etch stop layer 113 are known.

The intrinsic stress of the etch stop layer 113 may act on the transistor elements 102, 202 below the etch stop layer 113. Thus, a stress may be created in the substrate 101, in particular in portions of the substrate 101 below the gate electrodes 106, 206 wherein channel regions of the transistor elements 102, 202 will be formed. Hence, stressed channel regions may be provided in the first transistor element 102 and the second transistor element 202.

After the formation of the etch stop layer 113, a layer 114 of a dielectric material may be formed over the semiconductor structure 100 by means of known deposition techniques, such as chemical vapor deposition or plasma enhanced chemical vapor deposition. The dielectric material in the layer 104 may be selected such that the material of the etch stop layer 113 and the material of the layer 114 may be selectively etched. In examples of methods of forming a semiconductor structure according to the state of the art wherein the etch stop layer 113 comprises silicon nitride, the layer 114 comprises silicon dioxide and does not comprise an intrinsic stress.

FIG. 1b shows a schematic cross-sectional view of the semiconductor structure 100 in a later stage of the manufacturing process. After the formation of the layer 114, a chemical mechanical polishing process may be performed to planarize the layer 114. As persons skilled in the art know, in chemical mechanical polishing, the semiconductor structure 100 is moved relative to a polishing pad. A slurry comprising a chemical compound adapted to react chemically with the material of the layer 114 is supplied to an interface between the semiconductor structure 100 and the polishing pad. Products of the chemical reaction may be removed by abrasives contained in the slurry and/or in the polishing pad. In the chemical mechanical polishing process, a surface of the layer 114 is rendered substantially planar.

After the chemical mechanical polishing process, contact vias 115, 116, 117 are formed and filled with an electrically conductive material such as tungsten to provide electrical connections to the source region 107, the gate electrode 106 and the drain region 108 of the first transistor element 102. Similarly, contact vias 118, 119, 120 may be formed to provide electrical connections to the source region 207, the gate electrode 206 and the drain region 208 of the second transistor element 202.

To this end, a mask (not shown) may be formed over the semiconductor structure 100. The mask has openings at the locations at which the contact vias 115-120 are to be formed. Thereafter, an etch process adapted to selectively remove the material of the layer 114, leaving the material of the etch stop layer 113 substantially intact, may be performed. Due to the selectivity of the etch process, the etch process stops as soon as the etch front reaches the etch stop layer 113.

Thereafter, portions of the etch stop layer at the bottom of the contact vias 115-120 may be removed by means of an etch process adapted to selectively remove the material of the etch stop layer 113, leaving the materials of the layer 114 and the silicide regions 109, 110, 111, 209, 210, 211 substantially intact.

Subsequently, a layer of the electrically conductive material may be formed over the semiconductor structure 100 by means of a known deposition process, and a further chemical mechanical polishing process may be performed to remove portions of the layer of the electrically conductive material outside the contact vias 115-120.

A problem of the method of forming a semiconductor structure according to the state of the art described above is that the stress created by the intrinsically stressed etch stop layer 113 may be relatively weak, or may be insufficiently transmitted to portions of the substrate 101 below the gate electrodes 106, 206.

A further problem of the method of forming a semiconductor structure according to the state of the art described above is that both the first transistor element 102 and the second transistor element 202 are exposed to the stress created by the stressed etch stop layer 113. If the first transistor element 102 and the second transistor element 202 are transistors of a different type, the stress created by the stressed etch stop layer 113 may be adapted to improve the charge carrier mobility in one of the transistor elements 102, 202. For example, in case the first transistor element 102 is a P-type transistor and the second transistor element 202 is an N-type transistor, a compressive stress of the etch stop layer 113 may help to improve the performance of the first transistor element 102, but may have no influence on the performance of the second transistor element 202 or may even be detrimental to the performance of the second transistor element 202. Conversely, an intrinsic tensile stress of the etch stop layer 113 may help to improve the performance of the second transistor element 202 when being an N-type transistor, but may have no influence on the performance of the first transistor element 102 when being a P-type transistor or may even be detrimental to the performance of the first transistor element 102.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative example, a method of forming a semiconductor structure comprises providing a semiconductor substrate comprising at least one transistor element. An etch stop layer is formed over the transistor element. A stressed first dielectric layer is formed over the etch stop layer. A protective layer adapted to reduce an intrusion of moisture into the first dielectric layer is formed over the first dielectric layer. At least one electrical connection to the transistor element is formed. At least a portion of the protective layer remains over the first dielectric layer after a completion the formation of the at least one electrical connection.

According to another illustrative example, a method of forming a semiconductor structure comprises providing a semiconductor substrate comprising a first transistor element and a second transistor element. An etch stop layer is formed over the first transistor element and the second transistor element. A first dielectric layer is formed over the first transistor element and a second dielectric layer is formed over the second transistor element. The first dielectric layer and the second dielectric layer are formed over the etch stop layer. One of the first dielectric layer and the second dielectric layer comprises an intrinsic stress.

According to yet another illustrative example, a semiconductor structure comprises a semiconductor substrate comprising at least one transistor element. An etch stop layer is formed over the transistor element. A first dielectric layer comprising an intrinsic stress is formed over the etch stop layer. The semiconductor structure further comprises a protective layer adapted to reduce an intrusion of moisture into the first dielectric layer. The protective layer is formed over the first dielectric layer. A second dielectric layer is formed over the protective layer.

BRIEF DESCRIPTION OF THE DRAWINGS

The disclosure may be understood by reference to the following description taken in conjunction with the accompanying drawings, in which like reference numerals identify like elements, and in which.

Figure 1A:
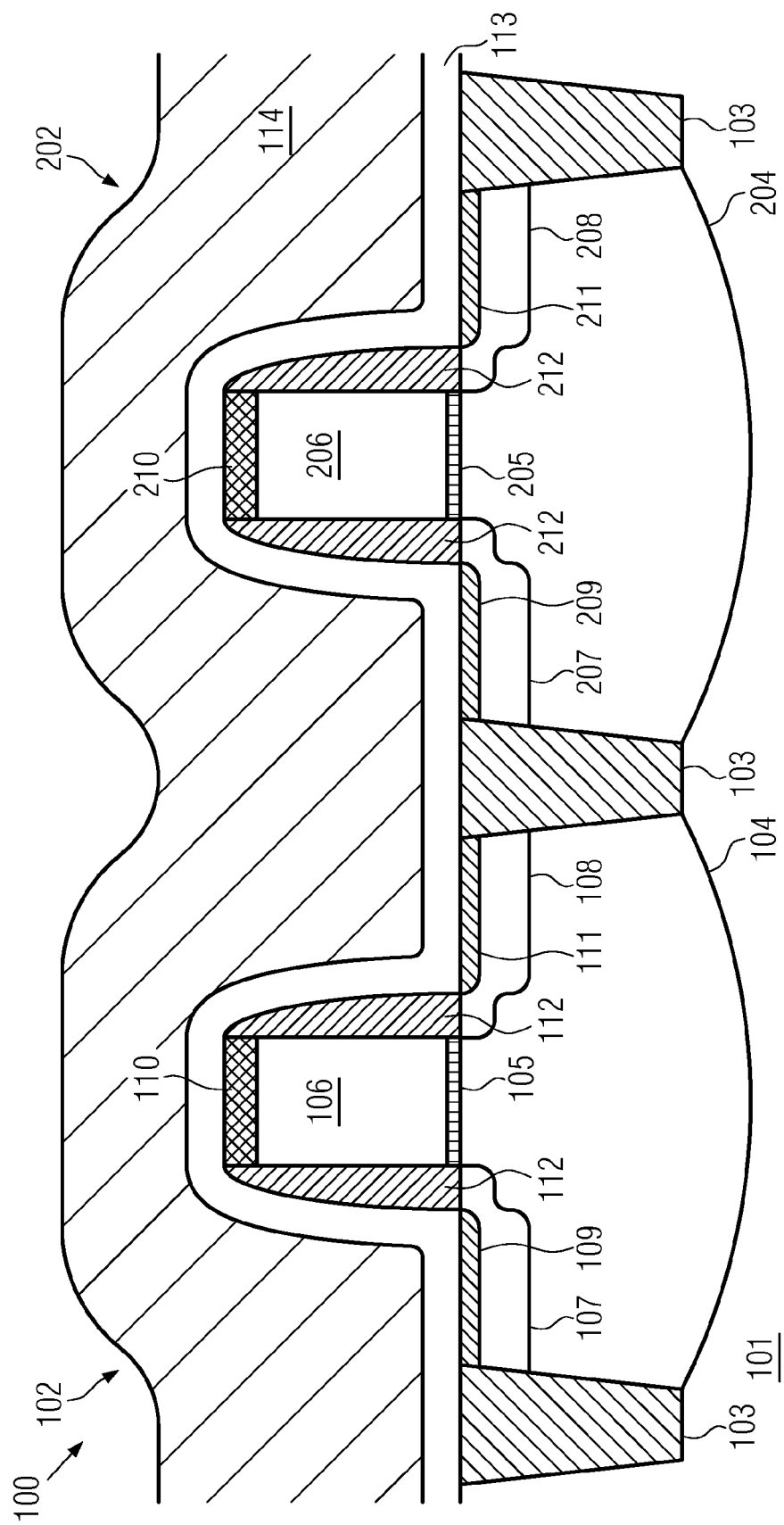
FIGS. 1a-1b show schematic cross-sectional views of a semiconductor structure in stages of a method of forming a semiconductor structure according to the state of the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to one illustrative embodiment, a method of forming a semiconductor structure comprises providing a semiconductor substrate comprising at least one transistor element. An etch stop layer may be formed over the transistor element. The etch stop layer need not be subject to an intrinsic stress. A first dielectric layer may be formed over the etch stop layer. The first dielectric layer may have a thickness which is greater than a thickness of the etch stop layer. In some embodiments, the thickness of the first dielectric layer may be greater than a height of the gate electrode of the transistor element. In other embodiments, however, the thickness of the first dielectric layer may be smaller than the height of the gate electrode.

The first dielectric layer may comprise an intrinsic stress which may be compressive or tensile. In some embodiments, the intrinsic stress of the first dielectric layer may be modified after the formation of the first dielectric layer, for example, by means of a plasma treatment. In some embodiments, the first dielectric layer may comprise silicon dioxide and may be formed by means of a chemical vapor deposition process or plasma enhanced chemical vapor deposition process, wherein a reactant gas comprises tetraethylorthosilicate. As persons skilled in the art know, chemical and/or physical properties of a silicon dioxide layer may be influenced by the composition of the reactant gas used in the deposition process. In the following, a silicon dioxide layer formed by means of a deposition process, wherein a reactant gas used comprises tetraethylorthosilicate, will be denoted as "tetraethylorthosilicate silicon dioxide."

In some embodiments, the intrinsic stress of the first dielectric layer may be modified by means of a plasma treatment process. In the plasma treatment process, the semiconductor structure may be inserted into a reactor chamber, and a glow discharge may be created in a reactant gas provided in the plasma chamber. In the glow discharge, chemically reactive species may be created from the reactant gas. The chemically reactive species may react with the material of the first dielectric layer such that the chemical and/or physical structure of the first dielectric layer is modified. The modification of the chemical and/or physical structure may lead to a modification of the intrinsic stress of the first dielectric layer, in particular to an enhancement of the intrinsic stress. In embodiments wherein the first dielectric layer comprises tetraethylorthosilicate silicon dioxide, an intrinsic tensile stress of the first dielectric layer may be enhanced by exposing the semiconductor structure to a plasma created by a glow discharge in a reactant gas comprising oxygen and/or nitrous oxide.

The intrinsic stress may be transmitted to other portions of the semiconductor structure such that the other portions of the semiconductor structure are stressed. In particular, portions of the substrate below the gate electrode of the transistor element may be stressed.

Figure 1B:
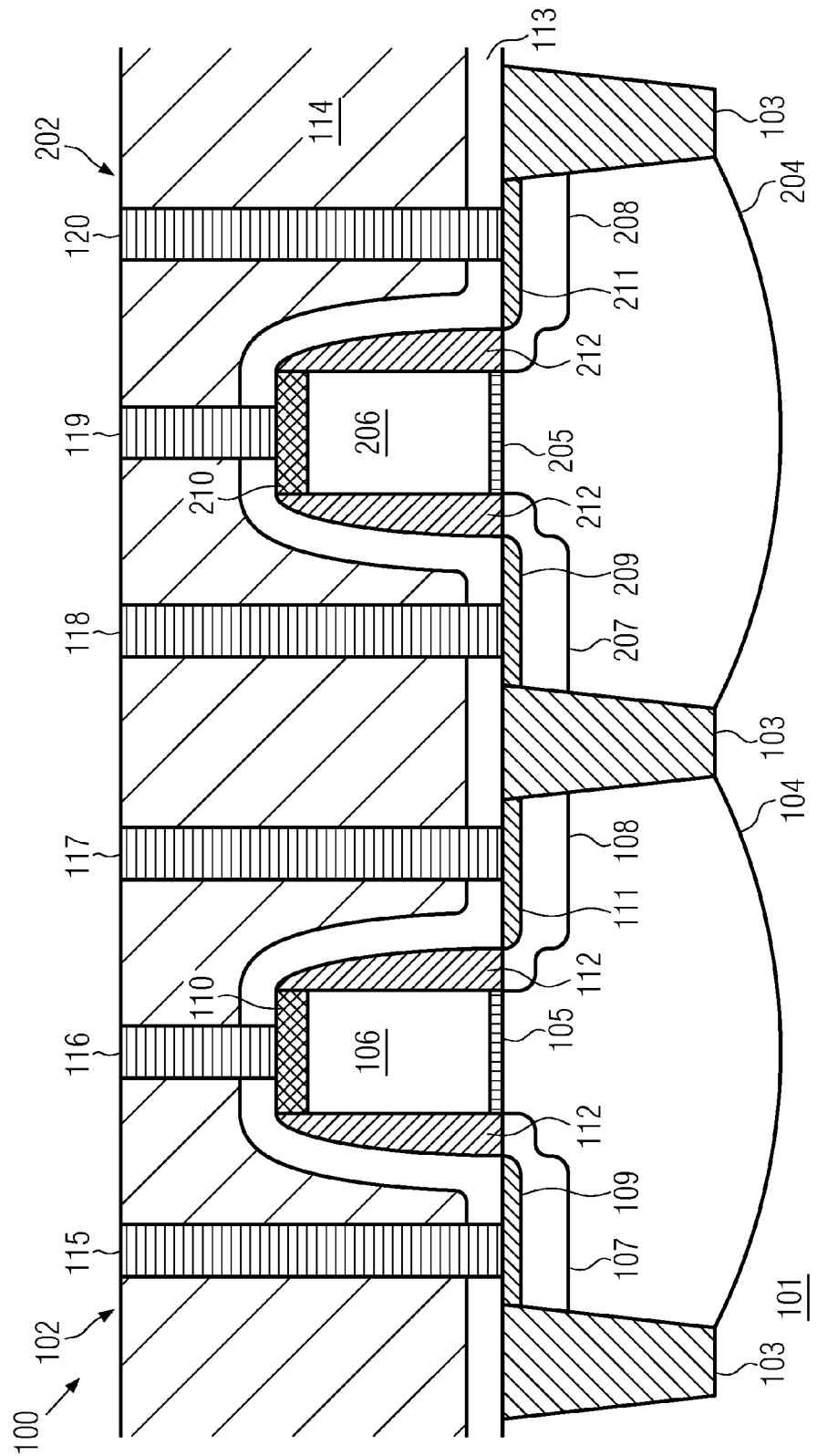

Since the first dielectric layer may have a greater thickness than the etch stop layer, the intrinsic stress of the first dielectric layer may have a greater influence on portions of the semiconductor structure below the first dielectric layer than the intrinsically stressed etch stop layer formed in the method according to the state of the art described above with reference to FIGS. 1a-1b. Hence, a greater stress may be created below the gate electrode of the transistor element than in a transistor element formed by means of the method according to the state of the art. This may allow an improvement of the mobility of charge carries in a channel region of the transistor element.

The intrinsic stress of the first dielectric layer may have a sensitivity with respect to an intrusion of moisture. Water molecules entering the first dielectric layer might react with the material of the first dielectric layer, which might lead to a relaxation of the intrinsic stress in the first dielectric layer.

In order to avoid or at least reduce an intrusion of moisture into the first dielectric layer, a protective layer may be formed over the first dielectric layer. In some embodiments, the protective layer may comprise silicon rich tetraethylorthosilicate silicon dioxide, wherein a density of silicon atoms per unit volume may be greater than about one half of a density of oxygen atoms per unit volume. As persons skilled in the art know, the silicon content of tetraethylorthosilicate silicon dioxide may be controlled by varying parameters of the deposition process.

In some embodiments, the protective layer may have a thickness which is adapted such that at least a portion of the protective layer is not removed during processing steps performed after the formation of the protective layer such as, for example, a chemical mechanical polishing process performed in the formation of electrical connections to the transistor element. Thus, substantially the entire first dielectric layer remains covered by the protective layer during and after the processing steps and remains protected by the protective layer.

In other embodiments, a second dielectric layer may be formed over the protective layer, wherein the second dielectric layer may have a thickness which is adapted such that at least a portion of the second dielectric layer is not removed during processing steps performed after the formation of the second dielectric layer. Hence, in the further processing steps, the protective layer may remain embedded between the first dielectric layer and the second dielectric layer such that the protective layer is not affected by the processing steps and keeps protecting the first dielectric layer.

In some embodiments, the semiconductor structure may comprise a first transistor element and a second transistor element. The first and the second transistor element may be transistors of a different type. For example, the first transistor element may be a P-type transistor and the second transistor element may be an N-type transistor.

In such embodiments, the first dielectric layer may be formed over one of the first and the second transistor element, and another dielectric layer which may comprise an intrinsic stress other than the intrinsic stress of the first dielectric layer may be formed over the second transistor element. Thus, a different stress may be provided in the first transistor element and the second transistor element. Hence, the stress below the gate electrodes of the first and the second transistor element may be adapted such that a mobility of charge carriers in both transistor elements may be improved, or such that a mobility of charge carriers in one of the transistor elements may be improved and adverse effects of stress on the mobility of charge carriers in the other transistor element may be substantially avoided.

Figure 2A:
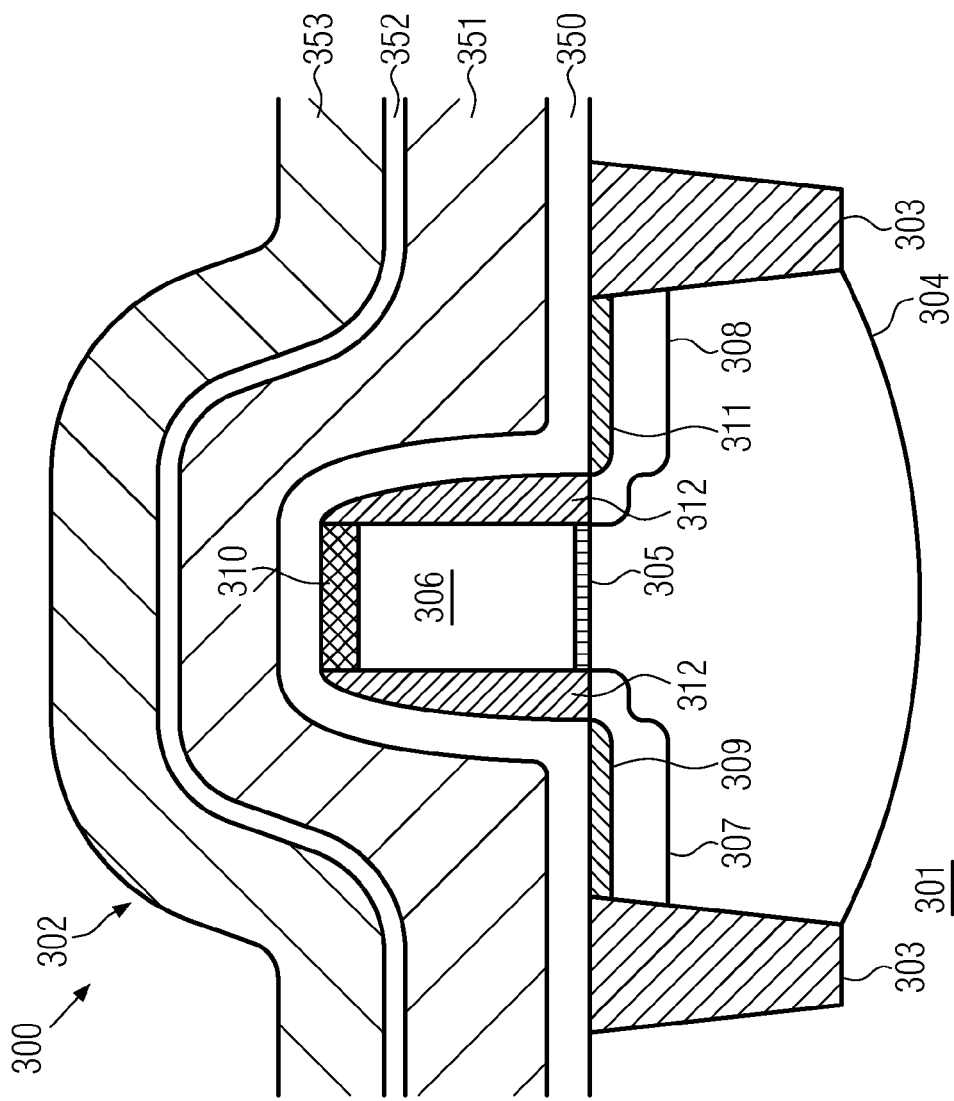
FIGS. 2a-2b show schematic cross-sectional views of a semiconductor structure in stages of a method of forming a semiconductor structure according to an illustrative embodiment disclosed herein.

FIG. 2a shows a schematic cross-sectional view of a semiconductor structure 300 in a first stage of a manufacturing process. The semiconductor structure 300 comprises a semiconductor substrate 301. In some embodiments, the semiconductor substrate 301 may be a silicon wafer, or a silicon-on-insulator (SOI) substrate. The substrate 301 comprises a transistor element 302. In addition to the transistor element 302, further transistor elements and circuit elements other than transistors, such as capacitors, resistors and/or electrically conductive lines (not shown), may be formed in the semiconductor structure 300. The transistor element 302 may comprise an active region 304 formed in the substrate 301, a gate electrode 306 formed over the active region 304 and separated therefrom by a gate insulation layer 305, a sidewall spacer structure 312 formed adjacent the gate electrode 306, a source region 307 and a drain region 308. In the source region 307, a silicide region 309 may be formed. Similarly, silicide regions 310, 311 may be provided in the gate electrode 306 and the drain region 308, respectively. A trench isolation structure 303 provides electrical insulation between the transistor element 302 and other circuit elements in the semiconductor structure which are not shown in FIG. 2a.

The above-described features may be formed by means of methods of photolithography, etching, deposition, oxidation, ion implantation and annealing, well known to persons skilled in the art.

An etch stop layer 350 is formed over the transistor element 302. The etch stop layer 350 may comprise a dielectric material, such as silicon nitride and/or silicon dioxide, and may be formed by means of known deposition processes, such as chemical vapor deposition and/or plasma enhanced chemical vapor deposition. The etch stop layer 350 need not comprise an intrinsic stress. In other embodiments, however, the etch stop layer 350 may comprise a tensile or compressive intrinsic stress.

A first dielectric layer 351 is formed over the etch stop layer 350. The first dielectric layer 351 may comprise a dielectric material such as silicon dioxide and/or silicon nitride which may be selectively etched with respect to the material of the etch stop layer 350. In embodiments wherein the etch stop layer 350 comprises silicon nitride, the first dielectric layer 351 may comprise silicon dioxide. In other embodiments wherein the etch stop layer 350 comprises silicon dioxide, the first dielectric layer 351 may comprise silicon nitride. Etch processes adapted to selectively remove silicon dioxide, leaving silicon nitride substantially unaffected, and etch processes adapted to selectively remove silicon nitride, leaving silicon dioxide substantially unaffected, are known to persons skilled in the art.

The first dielectric layer 351 may comprise an intrinsic stress. The formation of the first dielectric layer 351 may comprise known processes of chemical vapor deposition and plasma enhanced chemical vapor deposition. The intrinsic stress of the first dielectric layer may be controlled by varying parameters of the deposition process, such as composition and pressure of the reactant gas, the temperature of a reactor vessel wherein the deposition process is performed and, in embodiments wherein the first dielectric layer 251 is formed by means of a plasma enhanced chemical vapor deposition process, power and frequency of a radio frequency alternating voltage and a bias voltage applied to the reactant gas.

In some embodiments, after the formation of the layer 351, the semiconductor structure 300 may be subject to a plasma treatment adapted to modify the intrinsic stress of the first dielectric layer 351. As already mentioned above, in the plasma treatment, the semiconductor structure 300 may be positioned in a reactor vessel wherein a glow discharge is created in a reactant gas, for example, by applying a radio frequency alternating voltage to the reactant gas. In the glow discharge, chemically reactive species may be created which may react with the material of the first dielectric layer 351. Thus, the chemical and/or physical structure of the first dielectric layer 351 may be modified. This may lead to an increase of the intrinsic stress of the first dielectric layer 351.

The plasma treatment may be performed in the same reactor vessel as the deposition of the first dielectric layer 351. In such embodiments, after the deposition process, the composition of the reactant gas and further parameters, such as temperature, pressure and power, as well as amplitude of the radio frequency alternating voltage and the bias voltage, may be modified to perform the plasma treatment. In other embodiments, the deposition of the first dielectric layer 351 and the plasma treatment may be performed in different reactor vessels.

In some embodiments, the first dielectric layer 351 may comprise tetraethylorthosilicate silicon dioxide and may be formed by means of a plasma enhanced chemical vapor deposition process wherein the reactant gas comprises tetraethylorthosilicate and an oxidant such as oxygen and/or ozone. After the deposition process, the plasma treatment may be performed using a reactant gas comprising oxygen, nitrous oxide, ozone and/or nitrogen. A power of the radio frequency alternating voltage may, in some embodiments, have a value in a range from about 400-900 W. In particular, a power of about 450 W, 500 W and 800 W may be applied. The plasma treatment may remove silanol, which may be contained in tetraethylorthosilicate silicon dioxide. The removal of the silanol may provide extra spaces between atoms of the first dielectric layer 351 such that an intrinsic tensile stress of the first dielectric layer 351 may be created or increased.

In some embodiments, the first dielectric layer 351 may comprise an intrinsic tensile stress in a range from about 100-300 Mpa. The present disclosure is not restricted to embodiments wherein the first dielectric layer 351 comprises an intrinsic tensile stress. In other embodiments, the first dielectric layer 351 may comprise an intrinsic compressive stress in a range from about −400 to −500 Mpa.

The first dielectric layer may have a thickness in a range from about 50-200 nm. In one illustrative embodiment, the first dielectric layer 351 may have a thickness of about 160 nm.

After the formation of the first dielectric layer 351, a protective layer 352 may be formed over the first dielectric layer 351. The protective layer 352 may be adapted to substantially prevent or at least reduce an intrusion of moisture into the first dielectric layer.

Experiments performed by the inventors have shown that an intrusion of moisture into the first dielectric layer 351 may be detrimental to the intrinsic stress in the first dielectric layer. After exposure of a layer of tetraethylorthosilicate silicon dioxide comprising an intrinsic tensile stress of about 60 Mpa to air humidity for three days, the intrinsic tensile stress had disappeared and the layer comprised an intrinsic compressive stress of about 40 Mpa. In experiments wherein a protective layer 352 was formed over the tetraethylorthosilicate silicon dioxide layer 351, substantially no modification of the intrinsic tensile stress was observed.

In some embodiments, the protective layer 352 may comprise silicon-rich tetraethylorthosilicate silicon dioxide and may be formed by means of a plasma enhanced chemical vapor deposition process wherein parameters of the deposition process, in particular the composition of the reactant gas, are adapted such that a relatively high silicon content of the protective layer 352 may be obtained. In other embodiments, other materials may be used for the protective layer 352. The protective layer 352 may have a thickness in a range from about 10-30 nm. In one illustrative embodiment, the protective layer 352 may have a thickness of about 20 nm.

A second dielectric layer 353 may be formed over the protective layer 352. Similar to the first dielectric layer 351, the second dielectric layer 353 may comprise tetraethylorthosilicate silicon dioxide and may be formed by means of a chemical vapor deposition process or plasma enhanced chemical vapor deposition process known to persons skilled in the art. Other materials and deposition processes may be used as well. The second dielectric layer 353 need not comprise an intrinsic stress, and may be substantially unstressed. The present disclosure, however, is not restricted to embodiments wherein the second dielectric layer 353 is substantially unstressed. In other embodiments, the second dielectric layer 353 may comprise an intrinsic stress.

A thickness of the second dielectric layer 353 may be adapted such that at least a portion of the second dielectric layer 353 is not removed during processing steps which are performed after the formation of the second dielectric layer 353. These processing steps will be explained in more detail below. An amount of material removed in the processing steps may be readily determined by persons skilled in the art using routine experiments. Thus, throughout the manufacturing process, the entire protective layer 352 may remain covered by the second dielectric layer 353 such that the integrity of the protective layer 352 is not affected by the further processing steps. Hence, the protective layer 352 may protect the first dielectric layer 351 during the entire manufacturing process and after the completion of the manufacturing process.

After its formation, the second dielectric layer 353 may have a thickness in a range from about 300-700 nm. In one illustrative embodiment, the second dielectric layer may have a thickness of about 520 nm.

Figure 2B:
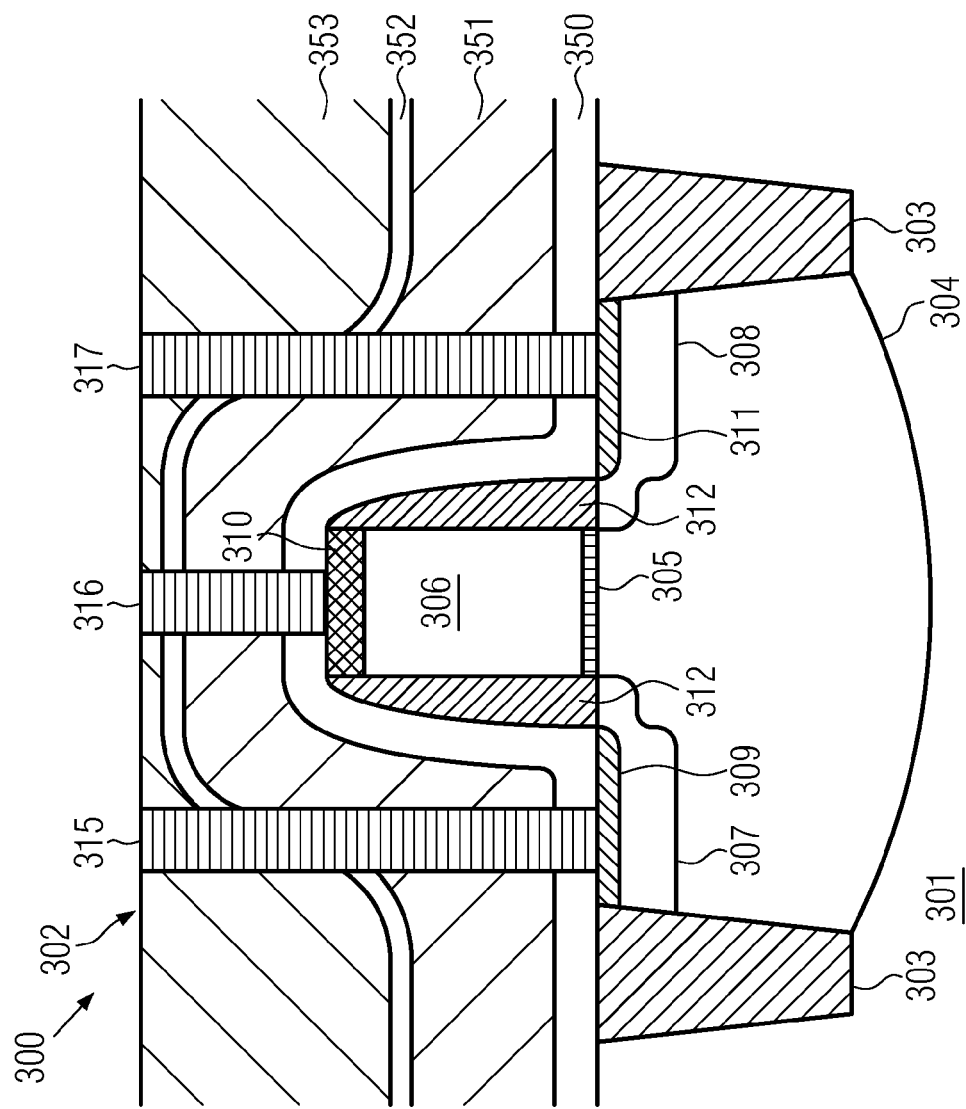

FIG. 2*b* shows a schematic cross-sectional view of the semiconductor structure 300 in a later stage of the manufacturing process. After the formation of the second dielectric layer 353, electrical connections to the source region 307, the gate electrode 306 and the drain region 308, respectively, of the transistor element 302 may be formed. The electrical connections may be provided in the form of contact vias 315, 316, 317 which are filled with an electrically conductive material such as tungsten.

To this end, a chemical mechanical polishing process may be performed to obtain a substantially planar surface of the second dielectric layer 353. Thereafter, a mask (not shown) may be formed over the second dielectric layer 353 by means of a known photolithography process. The mask may comprise openings at the locations at which the contact vias 315, 316, 317 are to be formed. Then, an etch process, for example an anisotropic dry etch process, may be performed to remove portions of the second dielectric layer 353, the protective layer 352 and the first dielectric layer 351 below the openings of the mask. The etch process may be adapted to selectively remove the material or materials of the layers 351, 352, 353, leaving the material of the etch stop layer 350 substantially intact. Therefore, the etch process may be stopped as soon as the etch front reaches the etch stop layer 350.

Subsequently, a further etch process may be performed to remove portions of the etch stop layer 350 at the bottom of the contact vias 315, 316, 317 such that the silicide regions 309, 310, 311 are exposed at the bottom of the contact vias 315, 316, 317. Then, the mask may be removed by means of a known resist strip process, a layer of electrically conductive material, for example a tungsten layer, may be deposited over the semiconductor structure 300, and a further chemical mechanical polishing process may be performed to remove portions of the layer of electrically conductive material outside the contact vias 315, 316, 317.

In the chemical mechanical polishing processes, as well as in the removal of the mask and in cleaning processes which may be performed between the steps performed in the formation of the electrical connections to the transistor element 302, portions of the second dielectric layer 353 may be removed such that the thickness of the second dielectric layer 353 is reduced. The initial thickness of the second dielectric layer 353 after the formation of the second dielectric layer may be greater than the thickness of the portion of the second dielectric layer which is removed in the chemical mechanical polishing processes and other processing steps performed to form the contact vias 315, 316, 317 and to fill the contact vias 315, 316, 317 with the electrically conductive material, such that the protective layer 352 remains covered by the second dielectric layer 353.

In some embodiments, after the formation of the contact vias 315, 316, 317 and after filling the contact vias 315, 316, 317, the first dielectric layer 351, the second dielectric layer 352 and the third dielectric layer 353 together may have a thickness in a range from about 250-450 nm.

Figure 3:
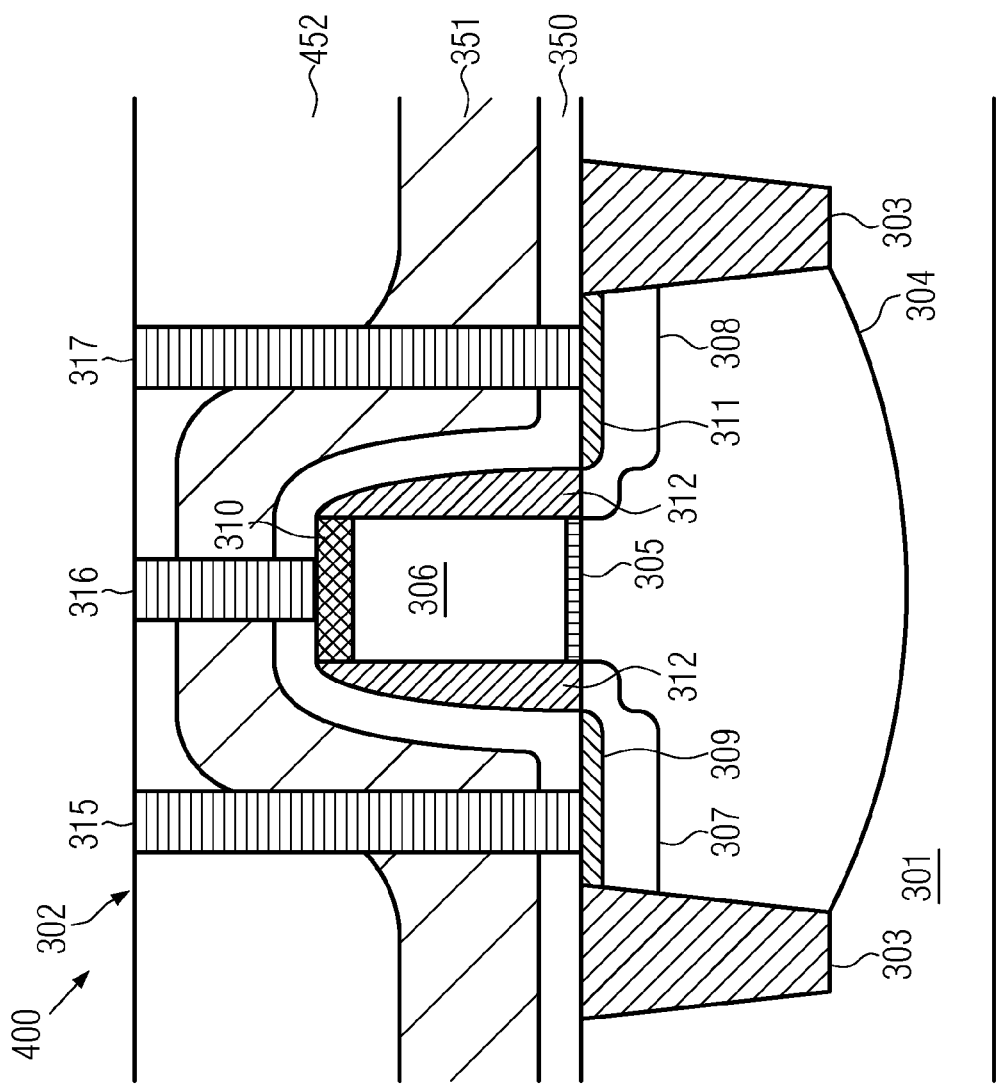
FIG. 3 shows a schematic cross-sectional view of a semiconductor structure in a stage of a method of forming a semiconductor structure according to another illustrative embodiment disclosed herein.

FIG. 3 shows a schematic cross-sectional view of a semiconductor structure 400 in a stage of a manufacturing process according to the present disclosure. For convenience, in FIGS. 2a-2b, as well as in FIG. 3, like reference numerals are used to denote like components.

The semiconductor structure 400 comprises a substrate 301 comprising a transistor element 302 and a trench isolation structure 303 providing electrical insulation between the transistor element 302 and other circuit elements in the substrate 302. The transistor element 302 comprises an active region 304, a gate electrode 306, a gate insulation layer 305, a source region 307 and a drain region 308. In the source region 307, the gate electrode 306, the drain region 308 and silicide regions 309, 310, 311 may be formed. These features may be formed by means of processing steps known to persons skilled in the art.

Similar to the method of forming a semiconductor structure described above with reference to FIGS. 2a-2b, an etch stop layer 350 and a first dielectric layer 351 comprising an intrinsic stress may be formed over the transistor element 302. Features of the etch stop layer 350 and the first dielectric layer 351 may correspond to those of the corresponding layers in the semiconductor structure 300 described above with reference to FIGS. 2a-2b.

After the formation of the first dielectric layer 351, a protective layer 452 may be formed over the first dielectric layer 351. The protective layer 452 may be formed by means of chemical vapor deposition and/or plasma enhanced chemical vapor deposition. The protective layer 452 may be adapted to substantially prevent or at least reduce an intrusion of moisture into the first dielectric layer 351. In some embodiments, the protective layer 452 may comprise silicon-rich tetraethylorthosilicate silicon dioxide.

After the formation of the protective layer 452, a chemical mechanical polishing process may be performed to planarize the surface of the protective layer 452, and electrical connections to the source region 307, the gate electrode 306 and the drain region 308 provided in the form of contact vias 315, 316, 317 filled with an electrically conductive material such as tungsten may be formed.

Similar to the embodiments described above with reference to FIGS. 2a-2b, the formation of the contact vias 315, 316, 317 may comprise forming a mask over the protective layer 452, performing an anisotropic etch process adapted to selectively remove the material of the first dielectric layer 351 and the protective layer 452, performing a further etch process adapted to selectively remove the material of the etch stop layer, removing the mask, depositing a layer of the electrically conductive material over the semiconductor structure 400 and performing a chemical mechanical polishing process to remove portions of the layer of the electrically conductive material outside the contact vias 315, 316, 317.

The thickness of the protective layer 452 may be adapted such that at least a portion of the protective layer 452 is not removed during the steps performed in the formation of the contact vias 315, 316, 317 filled with the electrically conductive material. In the chemical mechanical polishing processes, in the removal of the mask, and in cleaning processes which may optionally be performed between some or all of the steps of the formation of the electrical connections, portions of the protective layer 452 may be removed. The initial thickness of the protective layer 452 may be greater than the thickness of the removed portions. Hence, the entire first dielectric layer 351 remains covered by the protective layer 452 such that an intrusion of moisture into the first dielectric layer 351 and a reduction of the intrinsic stress of the first dielectric layer 351 resulting therefrom may be substantially avoided or at least reduced.

In some embodiments, after its formation, the protective layer 452 may have a thickness in a range from about 350-700 nm. In one illustrative embodiment, the protective layer 452 may be formed with a thickness of about 540 nm. After the formation of the contact vias 315, 316, 317 and the filling of the contact vias 315, 316, 317 with the electrically conductive material, the first dielectric layer 351 and the protective layer 452 together may have a total thickness in a range from about 250-450 nm.

Figure 4A:
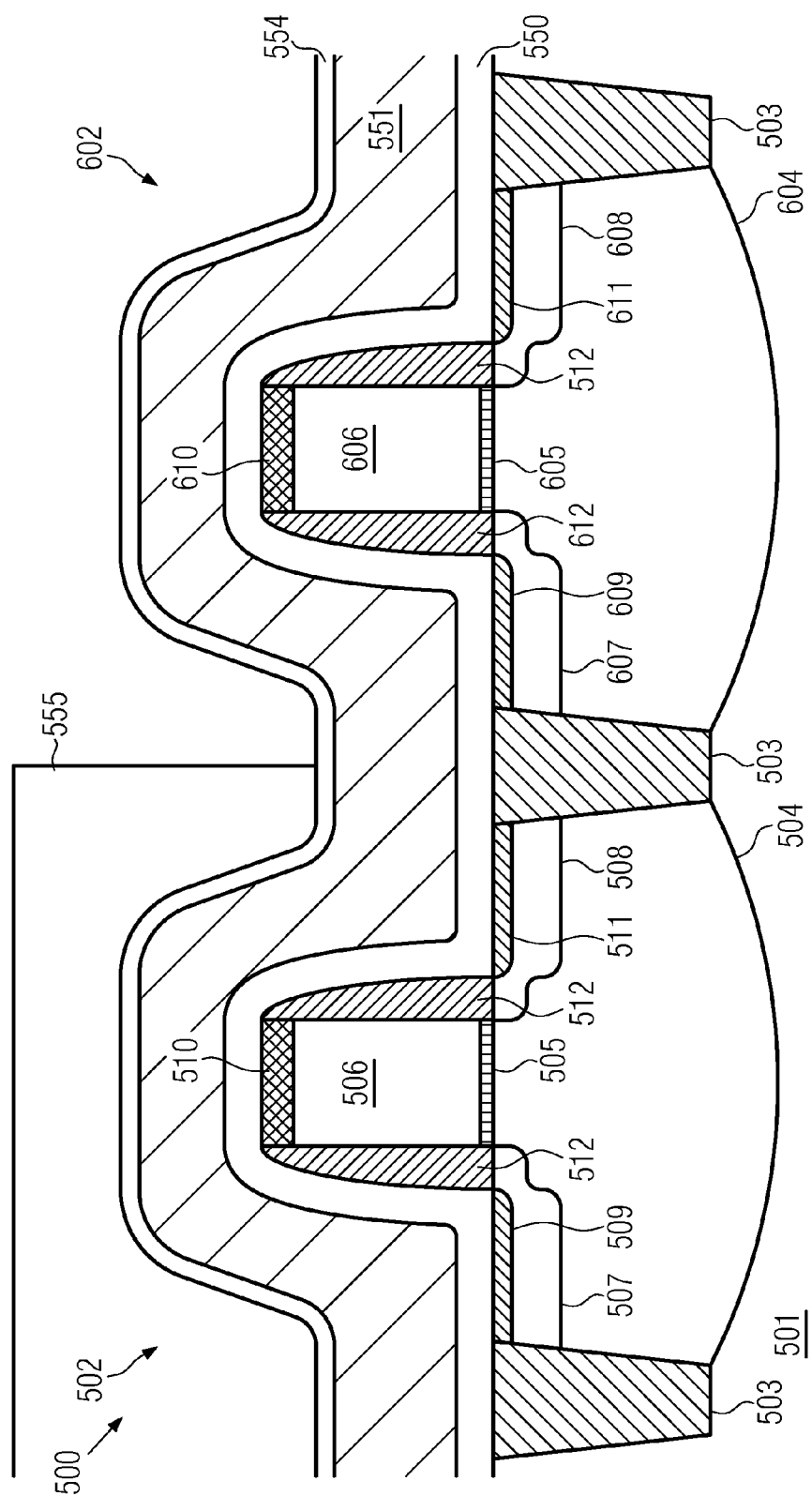
FIGS. 4a-4c show schematic cross-sectional views of a semiconductor structure in stages of a method of forming a semiconductor structure according to yet another illustrative embodiment disclosed herein.

FIG. 4a shows a schematic cross-sectional view of a semiconductor structure 500 in a stage of a manufacturing process according to an illustrative embodiment disclosed herein. The semiconductor structure 500 comprises a substrate 501. The substrate 501 comprises a first transistor element 502 and a second transistor element 602. A trench insulation structure 503 provides electrical insulation between the transistor elements 502, 602 and other circuit elements (not shown) in the semiconductor structure 500. The first transistor element 502 comprises a gate electrode 506 separated from an active region 504 by a gate insulation layer 505. In the active region 504, a source region 507 and a drain region 508 are formed adjacent the gate electrode 506. The gate electrode 506 is flanked by a sidewall spacer structure 512. Silicide regions 509, 510, 511 are formed in the source region 507, the drain region 508 and the gate electrode 506. Similar to the first transistor element 502, the second transistor element 602 comprises an active region 604, a gate electrode 606 flanked by a sidewall spacer structure 612, a gate insulation layer, a source region 607, a drain region 608 and silicide regions 609, 610, 611.

The first transistor element 502 and the second transistor element 602 may be transistors of a different type. In one embodiment, the first transistor element 502 may be a P-type transistor and the second transistor element 602 may be an N-type transistor. In other embodiments, the first transistor element 502 may be an N-type transistor and the second transistor element 602 may be a P-type transistor. In further embodiments, both the first transistor element 502 and the second transistor element 602 may be P-type transistors or N-type transistors.

The above-described features of the semiconductor structure 500 may be formed by means of semiconductor manufacturing techniques well known to persons skilled in the art.

An etch stop layer 550 may be formed over the first transistor element 502 and the second transistor element 602. Similar to the etch stop layer 350 described above with reference to FIGS. 2a, 2b and 3, the etch stop layer 550 may comprise a dielectric material, such as silicon nitride or silicon dioxide, and may be formed by means of techniques of chemical vapor deposition and/or plasma enhanced chemical vapor deposition known to persons skilled in the art.

Over the etch stop layer 550, a first dielectric layer 551 may be formed. The first dielectric layer 551 may comprise a dielectric material which may be etched selectively with respect to the material of the etch stop layer 550. In embodiments wherein the etch stop layer 550 comprises silicon dioxide, the first dielectric layer 551 may comprise silicon nitride. In embodiments wherein the etch stop layer 550 comprises silicon nitride, the first dielectric layer 551 may comprise silicon dioxide.

The first dielectric layer 551 may comprise an intrinsic stress which may be compressive or tensile. In the formation of the first dielectric layer 551, techniques of deposition and/or plasma treatment similar to those used in the embodiments described above with reference to FIGS. 2a, 2b and 3 for forming the layer 351 may be used. Features of the first dielectric layer 551, such as the thickness and the amount of the intrinsic stress, may correspond to those of the first dielectric layer 351 described above with reference to FIGS. 2a, 2b and 3.

Over the first dielectric layer 551, an etch stop layer 554 may be formed. The etch stop layer 554 may comprise a material which is selectively etchable with respect to the material of the first dielectric layer 551. In embodiments wherein the first dielectric layer 551 comprises one of silicon dioxide and silicon nitride, the etch stop layer 554 may comprise the other of silicon dioxide and silicon nitride.

After the formation of the etch stop layer 554, a mask 555 may be formed over the first transistor element 502. The mask 555 may comprise a photoresist and may be formed by means of techniques of photolithography well known to persons skilled in the art.

Figure 4B:
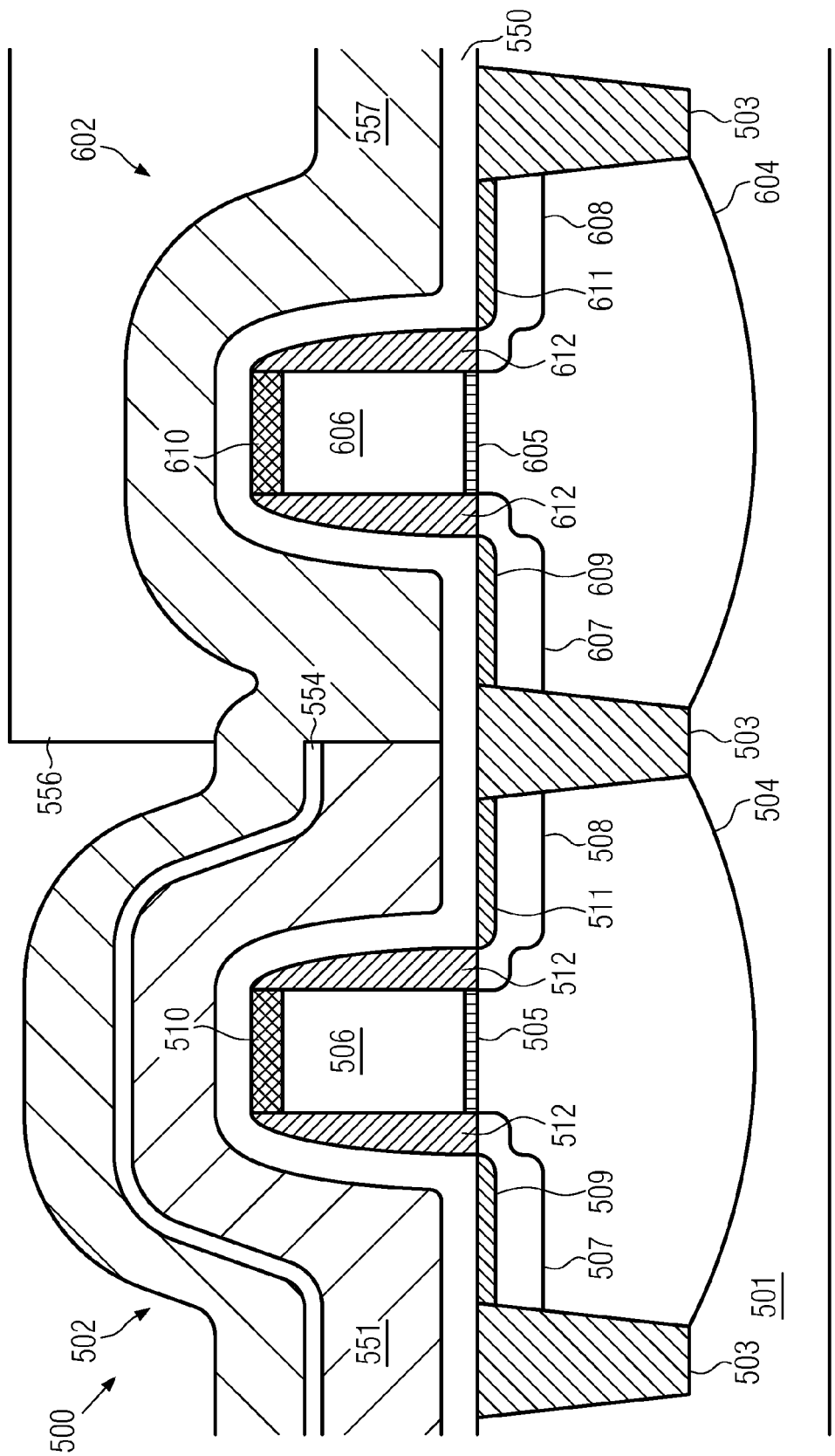

FIG. 4b shows a schematic cross-sectional view of the semiconductor structure 500 in a later stage of the manufacturing process. After the formation of the mask 555, an etch process adapted to remove the material of the etch stop layer 554 may be performed. Thus, a portion of the etch stop layer 554 over the second transistor element 602 may be removed to expose a portion of the first dielectric layer 551 over the second transistor element 602. Thereafter, another etch process adapted to selectively remove the material of the first dielectric layer 551, leaving the material of the etch stop layer 554 substantially intact, may be performed to remove a portion of the first dielectric layer 551 over the second transistor element 602. In the etch processes, the mask 555 may protect portions of the etch stop layer 554 and the first dielectric layer 551 over the first transistor element 502 from being affected by the etchant.

After the removal of the portion of the first dielectric layer 551 over the second transistor element 602, a second dielectric layer 557 may be formed over the semiconductor structure 500. Similar to the first dielectric layer 551, the second dielectric layer 557 may comprise an intrinsic stress, and may be formed by means of techniques of chemical vapor deposition, plasma enhanced chemical vapor deposition and plasma treatment as described above with reference to FIGS. 2a, 2b and 3 for the formation of the layer 351. A thickness of the second dielectric layer 557 may be substantially identical to the thickness of the first dielectric layer 551. Moreover, the second dielectric layer 557 may comprise substantially the same material as the first dielectric layer 551.

The intrinsic stress of the first dielectric layer 551 may be different from the intrinsic stress of the second dielectric layer 557. In some embodiments, one of the first dielectric layer 551 and the second dielectric layer 557 may comprise a compressive intrinsic stress and the other of the first dielectric layer 551 and the second dielectric layer 557 may comprise a tensile intrinsic stress. In other embodiments, one of the first dielectric layer 551 and the second dielectric layer 557 may comprise a compressive or tensile intrinsic stress, and the other of the first dielectric layer 551 and the second dielectric layer 557 may be substantially unstressed. In such embodiments, the unstressed one of the dielectric layers 551, 557 may be formed by means of techniques of chemical vapor deposition and/or plasma enhanced chemical vapor deposition known to persons skilled in the art. In one embodiment wherein the first transistor element 502 comprises a P-type transistor and the second transistor element 602 comprises an N-type transistor, the first dielectric layer 551 may comprise an intrinsic compressive stress, and the second dielectric layer 557 may comprise an intrinsic tensile stress or may be substantially unstressed. Since the stress of the first dielectric layer 551 and the second dielectric layer 557, respectively, may be transmitted to portions of the substrate 501 below the gate electrode 506 of the first transistor element 502 and the gate electrode 606 of the second transistor element 602, respectively, a different stress may be provided in channel regions which will be formed below the gate electrodes 506, 606 of the transistor elements 502, 602.

After the formation of the second dielectric layer 557, a mask 556, which may, in some embodiments, comprise a photoresist, may be formed over the second transistor element 602. This may be done by means of techniques of photolithography well known to persons skilled in the art.

Figure 4C:
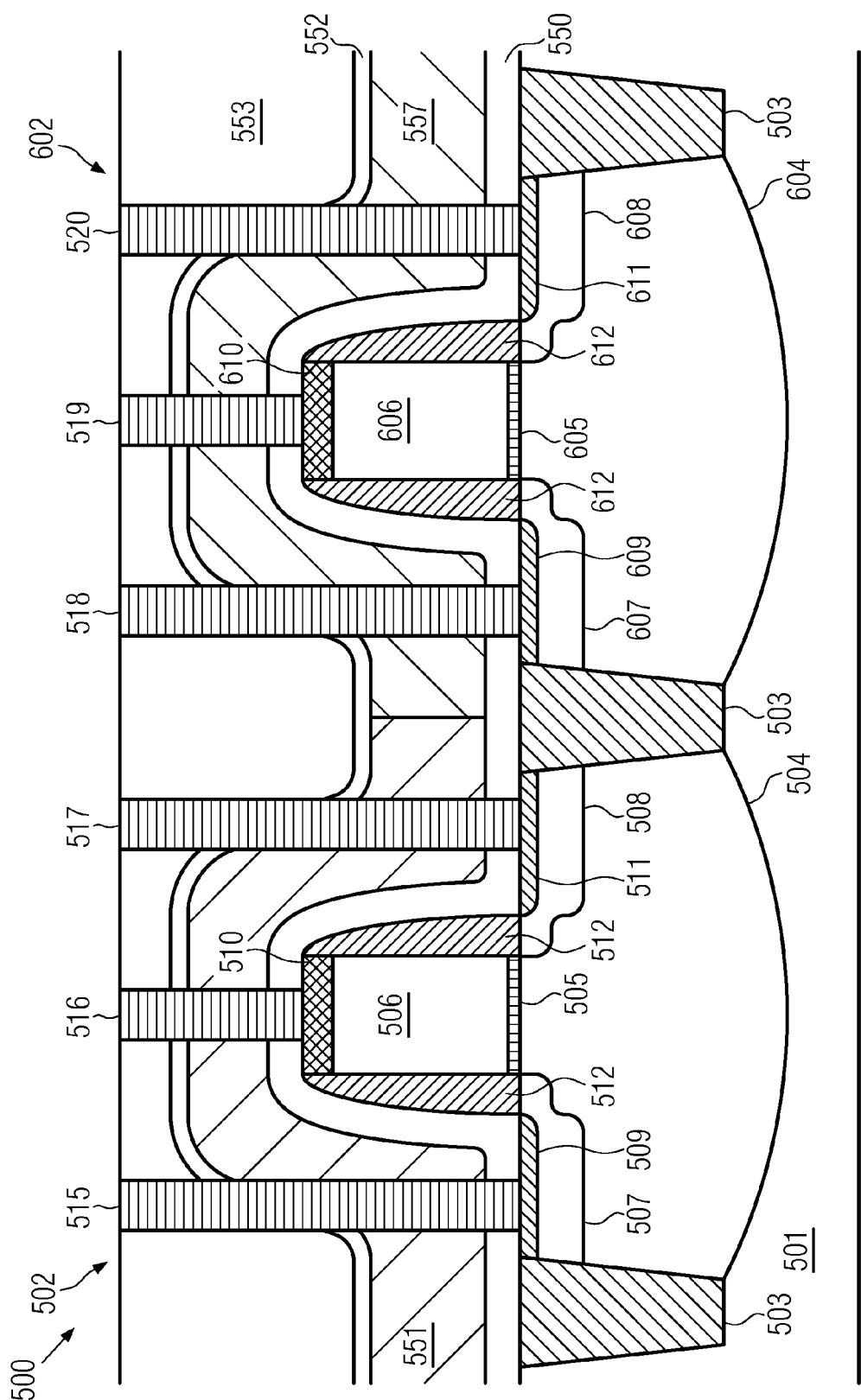

FIG. 4c shows a schematic cross-sectional view of the semiconductor structure 500 in a later stage of the manufacturing process. After the formation of the mask 556, an etch process adapted to remove the material of the second dielectric layer 557 may be performed. The etch process may be adapted to selectively remove the material of the second dielectric layer 557, leaving the material of the etch stop layer 554 substantially intact. Thus, the etch process stops as soon as the portion of the second dielectric layer 557 over the first transistor element 502 is substantially removed. The portion of the second dielectric layer 554 over the second transistor element 602 is protected by the mask 556 and may therefore remain substantially unaffected by the etch process.

After the etch process, the mask 556 may be removed by means of a known resist strip process, and another etch process adapted to selectively remove the material of the etch stop layer 554, leaving the material or materials of the first dielectric layer 551 and the second dielectric layer 557 substantially intact, may be performed to remove the portion of the etch stop layer 554 over the first transistor element 502. In other embodiments, the portion of the etch stop layer 554 over the first transistor element 502 may remain on the semiconductor structure 500.

The present disclosure is not restricted to embodiments wherein the etch process used to remove the portion of the second dielectric layer 557 over the first transistor element 502 is stopped by means of the etch stop layer 554. In other embodiments, the etch process may be stopped after the expiry of a predetermined etch time. In still further embodiments, an indicator layer comprising a material forming a compound when reacting with the etchant, wherein the presence of the compound in the etchant may be detected by means of known methods, may be formed over the first dielectric layer. In embodiments wherein the etch process comprises a dry etch process, the presence of the compound may be detected by means of spectroscopic techniques well known to persons skilled in the art. The etch process may be stopped upon a detection of the presence of the compound in the etchant, which indicates that the portion of the second dielectric layer 557 over the first transistor element 502 has been removed and the indicator layer is exposed on the surface of the semiconductor structure 500.

After the removal of the portion of the second dielectric layer 557 over the first transistor element 502, a protective layer 552 may be formed over the semiconductor structure 500. Similar to the protective layer 352 used in the embodiments described above with reference to FIGS. 2a-2b, the protective layer 552 may be adapted to substantially prevent or at least reduce an intrusion of moisture into the dielectric layers 551, 557 and may, in some embodiments, comprise silicon-rich tetraethylorthosilicate silicon dioxide. Further features of the protective layer 552 such as, for example, the thickness of the protective layer 552, may correspond to features of the protective layer 352 described above.

After the formation of the protective layer 552, a third dielectric layer 553 may be formed over the semiconductor structure 500. Similar to the second dielectric layer 353 in the embodiments described above with reference to FIGS. 2a, 2b and 3, the third dielectric layer 553 may, in some embodiments, comprise tetraethylorthosilicate silicon dioxide, and may be formed by means of a known chemical vapor deposition process or plasma enhanced chemical vapor deposition process. Materials other than tetraethylorthosilicate silicon dioxide may be employed as well. Features of the third dielectric layer 553 such as, for example, the thickness of the third dielectric layer 553, may correspond to features of the second dielectric layer 353 in the embodiments described above with reference to FIGS. 2a-2b.

The present invention is not restricted to embodiments wherein the protective layer 552 and the third dielectric layer 553 are formed. In other embodiments, the third dielectric layer 553 may be omitted and the protective layer 552 may have a thickness adapted such that a portion of the protective layer 552 remains on the entire first dielectric layer 551 and the entire second dielectric layer 557 during process steps performed after the formation of the protective layer 552. In such embodiments, features of the protective layer 552 may correspond to features of the protective layer 452 described above with reference to FIG. 3.

In still further embodiments, the protective layer 552 may be omitted and the third dielectric layer 553 may be formed over the first dielectric layer 551 and the second dielectric layer 557.

In still further embodiments, both the protective layer 552 and the third dielectric layer 553 may be omitted. In such embodiments, the first dielectric layer 551 and the second dielectric layer 557 may have a thickness greater than a height of the gate electrodes 506, 606.

Forming at least one of the protective layer 552 and the third dielectric layer 553, however, may help avoid problems in the formation of the first dielectric layer 551 and the second dielectric layer 557 which may be induced by the shape of the space between the gate electrodes 506, 606. In modern semiconductor structures, a distance between the first transistor element 502 and the second transistor element 602 may be relatively small. Therefore, the space between the gate electrodes 506, 606 may have the shape of a relatively narrow trench. In the above-described processes performed in the formation of the dielectric layers 551, 557, the shape of the space may hinder reactant gases used in the deposition of the dielectric layers 551, 557 and/or etch gases used in the etching of the dielectric layers 551, 557 from entering the space. This may lead to undesirable effects such as formation of voids. Forming at least one of the protective layer 552 and the third dielectric layer 553 may reduce the likelihood of such problems occurring, since, the dielectric layers 551, 557 may have a smaller thickness such that smaller amounts of material need to be deposited and removed.

After forming the first dielectric layer 551, the second dielectric layer 557 and, optionally, the protective layer 552 and/or the third dielectric layer 553, electrical connections to the transistor elements 502, 602 may be formed. The electrical connections may be provided in form of contact vias 515, 516, 517, 518, 519, 520 formed above the source regions 507, 607, the gate electrodes 506, 606 and the drain regions 508, 608 of the transistor elements 502, 602. Similar to the embodiments described above with reference to FIGS. 2a, 2b and 3, the formation of the electrical connections may comprise a chemical mechanical polishing process to planarize the surface of the semiconductor structure 500, a photolithographic process to form a mask over the semiconductor structure 500, one or more etch processes to form the contact vias 515-520, a deposition of a layer of the electrically conductive material and a further chemical mechanical polishing process to remove portions of the layer of the electrically conductive material outside the contact vias 515-520.

In embodiments wherein both the protective layer 552 and the third dielectric layer 553 are provided, a thickness of the third dielectric layer 553 may be adapted such that at least a portion of the third dielectric layer 553 remains on the entire protective layer 552 during and after the completion of the processing steps.

In embodiments wherein the protective layer 552 is formed and the third dielectric layer 553 is omitted, a thickness of the protective layer 552 may be adapted such that at least a portion of the protective layer 552 remains over the entire first dielectric layer 551 and the entire second dielectric layer 557 after the completion of the formation of the electrical connections.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
    providing a semiconductor substrate comprising at least one transistor element;
    forming an etch stop layer over said transistor element;
    forming a stressed first dielectric layer comprising an intrinsic tensile stress over said etch stop layer;
    forming a protective layer adapted to reduce an intrusion of moisture into the first dielectric layer over the first dielectric layer, wherein said protective layer comprises silicon-rich tetraethylorthosilicate silicon dioxide; and
    forming at least one electrical connection to said transistor element, wherein at least a portion of said protective layer remains over said first dielectric layer after a completion of said formation of said at least one electrical connection.

2. The method of claim 1, wherein a density of silicon atoms in said protective layer is greater than about one half of a density of oxygen atoms in said protective layer.

3. The method of claim 1, further comprising forming a second dielectric layer over said protective layer prior to said formation of said at least one electrical connection, wherein a thickness of said second dielectric layer is adapted such that at least a portion of said second dielectric layer is not removed during the formation of said at least one electrical connection.

4. The method of claim 3, wherein said second dielectric layer is formed with a thickness in a range from about 300-700 nm.

5. The method of claim 4, wherein said protective layer has a thickness in a range from about 10-30 nm.

6. The method of claim 1, wherein a thickness of said protective layer is adapted such that at least a portion of said protective layer is not removed during said formation of said at least one electrical connection.

7. The method of claim 6, wherein a thickness of said protective layer is in a range from about 350-700 nm.

8. The method of claim 1, wherein said first dielectric layer has a thickness in a range from about 50-200 nm.

9. The method of claim 1, wherein said formation of said first dielectric layer comprises:
    depositing said first dielectric layer over said semiconductor structure; and
    exposing said first dielectric layer to a plasma adapted to modify at least one of a physical and a chemical structure of said first dielectric layer to increase said intrinsic tensile stress.

10. The method of claim 1, wherein said at least one transistor element comprises a first transistor element, and the method further comprises:
    providing said semiconductor substrate comprising a second transistor element;
    forming said etch stop layer over said first and second transistor elements;
    forming said stressed first dielectric layer above said first transistor element;
    forming a second dielectric layer above said second transistor element;
    forming said protective layer over said first and second dielectric layers;
    forming at least a second electrical connection to said second transistor element, wherein at least a portion of said protective layer remains over said first and second dielectric layers after a completion of said formation of said at least one electrical connection and said second electrical connection.

11. The method of claim 10, wherein a density of silicon atoms in said protective layer is greater than about one half of a density of oxygen atoms in said protective layer.

12. The method of claim 10, wherein forming said second dielectric layer further comprises forming a stressed second dielectric layer, said second dielectric layer having a different type of stress than said first dielectric layer.

13. The method of claim 10, further comprising forming a third dielectric layer over said first dielectric layer and said second dielectric layer.

14. The method of claim 10, further comprising forming a third dielectric layer over said protective layer.

* * * * *